(12) United States Patent
Hao

(10) Patent No.: US 10,338,127 B2
(45) Date of Patent: Jul. 2, 2019

(54) METHOD AND SYSTEM FOR IDENTIFYING FULL PARAMETERS OF ELEMENT BY FAULT RECORDING AND FAULT LOCATING METHOD

(71) Applicant: Yushan Hao, Baoding (CN)

(72) Inventor: Yushan Hao, Baoding (CN)

(73) Assignee: Yushan Hao, Hebei (CN)

( * ) Notice: Subject to any disclaimer, the term of this patent is extended or adjusted under 35 U.S.C. 154(b) by 318 days.

(21) Appl. No.: 14/914,936

(22) PCT Filed: Jul. 7, 2014

(86) PCT No.: PCT/CN2014/081746
§ 371 (c)(1),
(2) Date: Feb. 26, 2016

(87) PCT Pub. No.: WO2015/027757
PCT Pub. Date: Mar. 5, 2015

(65) Prior Publication Data
US 2016/0202308 A1    Jul. 14, 2016

(30) Foreign Application Priority Data
Aug. 28, 2013 (CN) .......................... 2013 1 0383000

(51) Int. Cl.
*H02H 3/34* (2006.01)
*H02J 3/00* (2006.01)
(Continued)

(52) U.S. Cl.
CPC ....... *G01R 31/088* (2013.01); *G01R 19/2513* (2013.01); *G01R 31/08* (2013.01);
(Continued)

(58) Field of Classification Search
CPC ................................................ G01R 31/088
(Continued)

(56) References Cited

U.S. PATENT DOCUMENTS

| 2009/0059447 A1* | 3/2009 | Gajic | ............... H02H 7/045 |
|---|---|---|---|
| | | | 361/35 |
| 2012/0086459 A1 | 4/2012 | Kim | |
| 2013/0116944 A1 | 5/2013 | Seibel et al. | |

FOREIGN PATENT DOCUMENTS

| CN | 1632783 A | 6/2005 |
|---|---|---|
| CN | 101141062 A | 3/2008 |
| (Continued) | | |

OTHER PUBLICATIONS

"Unit parameter identification based on fault recorder" Electric Power Automation Equipment 32(8): 27-34, 2012.
(Continued)

*Primary Examiner* — Marc Anthony Armand
(74) *Attorney, Agent, or Firm* — Troutman Sanders LLP

(57) ABSTRACT

The invention discloses a method for identifying full parameters of an electric element by a fault recording data, comprising steps: inputting fault recording data related to an electric element; conducting data processing on the fault recording data; identifying full parameters of the element by intercepted data and a differential equation of the full parameters of the element; and outputting an identified result. Further proposed are a system for identifying full parameters of a power generator by fault recording data and a method for locating a line fault point with fault recording data. With the implementation of the invention, a fault resistance and full parameters of an element such as an electric line and a transformer, etc. can be identified. The invention can obtain full parameters of a fault element and also a non-fault element, and the parameters precision would be increased from the current 20% to less than 1%.

6 Claims, 4 Drawing Sheets

(51) Int. Cl.
  *G01R 19/25* (2006.01)
  *G01R 31/08* (2006.01)
  *H02J 13/00* (2006.01)
(52) U.S. Cl.
  CPC ............... *H02H 3/343* (2013.01); *H02J 3/00* (2013.01); *H02J 13/00* (2013.01); *G01R 19/2509* (2013.01); *H02J 2003/007* (2013.01); *Y02E 60/76* (2013.01); *Y04S 40/22* (2013.01)
(58) Field of Classification Search
  USPC ......................................................... 702/59
  See application file for complete search history.

(56) References Cited

FOREIGN PATENT DOCUMENTS

| CN | 101354423 A | 1/2009 |
|----|-------------|--------|
| CN | 101813753 A | 8/2010 |
| CN | 102946253 A | 2/2013 |
| CN | 103106341 A | 5/2013 |
| JP | 2000074978 A | 3/2000 |
| JP | 3345751 B2 | 11/2002 |
| JP | 3756026 B2 | 3/2006 |

OTHER PUBLICATIONS

Rico, et al., "An algebraic approach for identifying operating point dependent parameters of synchronous machines using orthogonal series expansions", IEEE Transactions on Energy Conversion 16(1): 92-97, 2001.
International Search Report, dated Oct. 10, 2014, issued in corresponding International Application No. PCT/CN2014/081746.
Chinese Search Report, dated Apr. 3, 2015, issued in corresponding Chinese Patent Application No. 201310383000.

* cited by examiner

US 10,338,127 B2

METHOD AND SYSTEM FOR IDENTIFYING FULL PARAMETERS OF ELEMENT BY FAULT RECORDING AND FAULT LOCATING METHOD

FIELD OF THE INVENTION

The present invention relates to an automation technology of a power grid, and in particular, to an element parameter technology of a power system and a fault locating technology.

BACKGROUND OF THE INVENTION

A lot of fault recording devices are installed in a power grid, once a fault occurs, the fault recording devices would start and record fault data including voltage and current instantaneous values of the three-phase a, b, c and the zero sequence, tens to hundreds of values are recorded in each cycle, and hundreds of fault occur in each province power grid every year thereby generating massive fault recording data.

On the other hand, as parameters error of an electric element is relatively large, it is necessary to extract parameters from the fault recording data. However, problems due to that the fault current contains direct current (DC) decay component, the three-phase parameters are inconsistent and the recording data is not synchronized, etc. cause large errors of the fault recording data, the decomposed sine component and the extracted line positive or negative zero sequence parameters, and requirements for the power grid computing or analyzing cannot be satisfied.

SUMMARY OF THE INVENTION

One objective of the present invention is to solve the aforementioned technical problems and to exactly identify full parameters of an electric system element such as a line, a transformer and a power generator, etc. from fault recording data.

A method for identifying full parameters of an electric element by a fault recording data, characterized in that, comprises the following steps:

S1: inputting fault recording data related to an electric element;

S2: conducting data processing on the fault recording data, comprising: S21, transforming scale, S22, aligning time scale of the recording data, and S23, intercepting data during the fault time;

S3: identifying full parameters of the element by the intercepted data and an differential equation of the full parameters of the element; and S4: outputting an identified result.

For a two-port element, there are inputted the sampling values and sampling times of the element left-side three-phase voltages $u_{a1}$, $u_{b1}$, $u_{c1}$ and a zero sequence voltage $u_{o1}$, the left-side three-phase currents $i_{a1}$, $i_{b1}$, $i_{c1}$ and a zero sequence current $i_{o1}$, and the right-side three-phase voltages $u_{a2}$, $u_{b2}$, $u_{c2}$ and a zero sequence voltage $u_{o2}$, the right-side three-phase currents $i_{a2}$, $i_{b2}$, $i_{c2}$ and a zero sequence current $i_{o2}$: the left-side $\{u_{a1k}, u_{b1k}, u_{c1k}, u_{o1k}, i_{a1k}, i_{b1k}, i_{c1k}, i_{o1k}, t_{1k}\}$ and the right-side $\{u_{a2j}, u_{b2j}, u_{c2j}, u_{o2j}, i_{a2j}, i_{b2j}, i_{c2j}, i_{o2j}, t_{2j}\}$, k=1, 2, . . . , N, j=1, 2, . . . , M;

For a three-port element, there are inputted the sampling values and sampling times of the element first-side three-phase voltages $u_{a1}$, $u_{b1}$, $u_{c1}$ and a zero sequence voltage $u_{0i}$, first-side three-phase currents $i_{a1}$, $i_{b1}$, $i_{c1}$ and a zero sequence current $i_{o1}$, second-side three-phase voltages $u_{a2}$, $u_{b2}$, $u_{c2}$ and a zero sequence voltage $u_{o2}$, second-side three-phase current $i_{a2}$, $i_{b2}$, $i_{c2}$ and a zero sequence current $i_{o2}$ and third-side three-phase voltages $u_{a3}$, $u_{b3}$, $u_{c3}$ and a zero sequence voltage $u_{o3}$, third-side three-phase current $i_{a3}$, $i_{b3}$, $i_{c3}$ and a zero sequence current $i_{o3}$: the first-side $\{u_{a1k}, u_{b1k}, u_{c1k}, u_{o1k}, i_{a1k}, i_{b1k}, i_{c1k}, i_{o1k}, t_{1k}\}$, the second-side $\{u_{a2j}, u_{b2j}, u_{c2j}, u_{o2j}, i_{a2j}, i_{b2j}, i_{c2j}, i_{o2j}, t_{2j}\}$ and the third side $\{u_{a31}, u_{b31}, u_{c31}, u_{o31}, i_{a31}, i_{b31}, i_{c31}, i_{o31}, t_{31}\}$, k=1, 2, . . . , N, j=1, 2, . . . , M, l=1, 2, . . . , L.

Said step S21 of transforming scale comprises: multiplying the voltages of the two-side/three side recording data to their respective PT ratio, then divided by a unified voltage base, and multiplying the currents to their respective CT ratio, then divided by a unified current base; said step S22 of aligning time scale of the recording data comprises taking a principle of aligning the mutation time of the two-side/three-side voltages $u_{o1}$, $u_{o2}/u_{o1}$, $u_{o2}$, $u_{o3}$; and said step S23 of intercepting the data during fault time comprises: only intercepting data during the fault time period, with the data before the fault and after removal of the fault being removed.

Steps of digital filtering S23a and re-sampling S23b can also be inserted before the step S23.

Said step of S23a comprises: determining an upper limit $f_{cs}$ for the sampling frequency, wherein said digital filtering uses a low-pass filter whose cut-off frequency $f_c$ is less than $f_{cs}$ for filtering the high-frequency signals to avoid frequency mixing when conducting re-sampling.

Said step of S23b comprises: conducting re-sampling on the recording data with a frequency which is less than or equal to $f_{cs}$, adopting the same re-sampling frequency for the two-side/three-side, and for the two-port element, outputting data:

$$u_{abc1k} = \begin{bmatrix} u_{a1k} \\ u_{b1k} \\ u_{c1k} \end{bmatrix},$$

$$i_{abc1k} = \begin{bmatrix} i_{a1k} \\ i_{b1k} \\ i_{c1k} \end{bmatrix},$$

$$u_{abc2k} = \begin{bmatrix} u_{a2k} \\ u_{b2k} \\ u_{c2k} \end{bmatrix},$$

$$i_{abc2k} = \begin{bmatrix} i_{a2k} \\ i_{b2k} \\ i_{c2k} \end{bmatrix},$$

$$k = 1, 2, \ldots, n;$$

for the three-port element, outputting data:

$$u_{abc1k} = \begin{bmatrix} u_{a1k} \\ u_{b1k} \\ u_{c1k} \end{bmatrix},$$

$$i_{abc1k} = \begin{bmatrix} i_{a1k} \\ i_{b1k} \\ i_{c1k} \end{bmatrix},$$

$$u_{abc2k} = \begin{bmatrix} u_{a2k} \\ u_{b2k} \\ u_{c2k} \end{bmatrix},$$

$$i_{abc2k} = \begin{bmatrix} i_{a2k} \\ i_{b2k} \\ i_{c2k} \end{bmatrix},$$

$$u_{abc3k} = \begin{bmatrix} u_{a3k} \\ u_{b3k} \\ u_{c3k} \end{bmatrix}.$$

$$i_{abc3k} = \begin{bmatrix} i_{a3k} \\ i_{b3k} \\ i_{c3k} \end{bmatrix},$$

$$k = 1, 2, \ldots, n.$$

Considering that the voltage of the two-side/three-side recording data goes through a voltage transformer PT and the current goes through a current transformer CT, the two-side/three-side PT ratio and CT ratio may be same or different. Generally, it needs to conduct transforming of scales, multiplying the voltages to the PT ratio, multiplying the current to the CT ratio, and unifying the two-side/three-side ratios. As the time of the two-side/three-side recording data are often out of time synchronization, it needs further to align the time scale, and the method for aligning the time scale is aligning the mutation times of the two-side zero sequence voltages $u_{o1}$ and $u_{o2}$ or aligning the mutation times of the three-side zero sequence voltages $u_{o1}$, $u_{o2}$ and $u_{o3}$. Finally, the fault recording data during fault time are intercepted and outputted.

CN Application No. 201210408534 provides an upper limit and a lower limit of the sampling frequency, and in practice, the sampling frequency of the fault recording data is often larger than the upper limit $f_{cs}$ of the sampling frequency, so that the recording data needs to be re-sampled. In order to avoid frequency mixing error caused by re-sampling, it needs to firstly conduct low-pass digital filtering for the recording data, whose cut-off frequency is far less than $f_{cs}$; then re-sampling with a frequency less than or equal to $f_{cs}$, is performed, in which the two-side/three-side re-sampling frequency are demanded to be same; and finally the recording data during fault time are intercepted and outputted.

The step S3 of identifying full parameters of the element by a differential equation of the full parameters of the element comprises:

firstly writing out a differential equation of full parameters of the element according to the electric knowledge, and changing it into state equations as follows:

$$\frac{d}{dt}X = A \cdot X + B \cdot u$$

$$y = C \cdot X + D \cdot u$$

where X is a state variable vector, t is time, u is a control vector, y is a output vector, A is a state matrix, and B, C and D are matrixes or vectors;

then identifying the estimated values $\hat{A}$, $\hat{B}$, $\hat{C}$, $\hat{D}$ for the matrixes A, B, C, D; and determining a resistance matrix R, a inductance matrix L and a capacitance matrix C from $\hat{A}$, $\hat{B}$, $\hat{C}$, $\hat{D}$ according to the relationship of A, B, C, D and the element parameters RLC for deducing the differential equation of full parameters of the element.

The present invention further provides a system for identifying full parameters of a power generator by a fault recording data, comprising:

a fault recording device of a power generator, used for measuring and storing fault recording data, comprising: conducting sampling for a power frequency period $f_0$ of a power grid, a generator terminal three-phase voltage $u_{abc}$, a three-phase current $i_{abc}$, a rotational speed $\omega$ of the power generator, a power angle $\delta$, a exciting voltage $u_f$ and a exciting current $i_f$ for obtaining corresponding sampling values; according to $$\alpha = \frac{d\omega}{dt}$$

and $\omega_0=2\pi f_0$, calculating sampling values of a accelerated speed $\alpha$ of a rotor and a angular frequency $\omega_0$ of the power grid; and recording and storing sampling times and the sampling values, wherein the fault recording begins at 2 to 10 cycles before short circuit and stops until the fault is removed and the rotational speed of the generator is stable;

a data processing unit, used for transforming scale and conducting digital low-pass filtering on the recording data, and then conducting re-sampling and outputting; and a parameter identifying unit, used for identifying full parameters of the power generator and its controlling system by a differential equation of full parameters of the power generator and its controlling system;

wherein said data processing unit and the parameter identifying unit is able to be located in the fault recording device or on a computer.

The present invention further provides a method for locating a line fault point with a fault recording data, comprising the following steps:

S1: inputting fault recording data of a line;

S2: conducting data processing on the data, comprising: S21 transforming scale, S22 aligning time scale of the recording data, S23 conducting digital low-pass filtering, S24 re-sampling, S25 intercepting the data during the fault time;

S3: identifying a transition resistance and the ratio β of the right-side line length and the left-side line length of the fault point with the data during the fault time and a differential equation of full parameters of the fault line;

wherein said differential equations of the full parameters are:

$$R_{abc1} \cdot i_{abc1p} + L_{abc1} \cdot \frac{d}{dt}i_{abc1p} = u_{abc1} - u_{abcf}$$

$$R_{abc2} \cdot i_{abc2p} + L_{abc2} \cdot \frac{d}{dt}i_{abc2p} = u_{abc2} - u_{abcf}$$

$$u_{abcf} = R_{abcf} \cdot i_{abcf}$$

$$i_{abcf} = i_{abc1} + i_{abc2}$$

$$i_{abc1p} = i_{abc1} - G_{abc1} \cdot u_{abc1} - C_{abc1} \cdot \frac{d}{dt}u_{abc1}$$

$$i_{abc2p} = i_{abc2} - G_{abc2} \cdot u_{abc2} - C_{abc2} \cdot \frac{d}{dt}u_{abc2}$$

-continued where $$R_{abc2} = \beta \cdot R_{abc1},$$

$$L_{abc2} = \beta \cdot L_{abc1},$$

$$C_{abc2} = \beta \cdot C_{abc1},$$

$$G_{abc2} = \beta \cdot G_{abc1},$$

$$R_{abc1} = \begin{bmatrix} r_{a1} & r_{ab1} & r_{ac1} \\ r_{ab1} & r_{b1} & r_{bc1} \\ r_{ac1} & r_{bc1} & r_{c1} \end{bmatrix},$$

$$L_{abc1} = \begin{bmatrix} l_{a1} & m_{ab1} & m_{ac1} \\ m_{ab1} & l_{b1} & m_{bc1} \\ m_{ac1} & m_{bc1} & l_{c1} \end{bmatrix},$$

$$C_{abc1} = \begin{bmatrix} c_{a1} & c_{ab1} & c_{ac1} \\ c_{ab1} & c_{b1} & c_{bc1} \\ c_{ac1} & c_{bc1} & c_{c1} \end{bmatrix},$$

$$G_{abc1} = \begin{bmatrix} g_{a1} & g_{ab1} & g_{ac1} \\ g_{ab1} & g_{b1} & g_{bc1} \\ g_{ac1} & g_{bc1} & g_{c1} \end{bmatrix},$$

$$R_{abcf} = \begin{bmatrix} r_{af} & 0 & 0 \\ 0 & r_{bf} & 0 \\ 0 & 0 & r_{cf} \end{bmatrix},$$

where $R_{abcf}$ is determined by the fault type, and if a is connected to the ground, $r_{bf}=\infty$, $r_{cf}=\infty$, $r_{af}=r_f$; if b is connected to the ground, $r_{af}=\infty$, $r_{cf}=\infty$, $r_{bf}=r_f$; if c is connected to the ground, $r_{af}=\infty$, $r_{bf}=\infty$, $r_{cf}=\infty$; if a and b are both connected to the ground, $r_{af}=r_{f1}$, $r_{bf}=r_{f2}$, $r_{cf}=\infty$; if b and c are both connected to the ground, $r_{af}=\infty$, $r_{bf}=r_{f1}$, $r_{cf}=r_{f2}$; if a and c are both connected to the ground, $r_{af}=r_{f1}$, $r_{bf}=\infty$, $r_{cf}=r_{f2}$; and S4: outputting the transition resistances $r_f$ or $r_{f1}$ and $r_{f2}$ and the position of the fault point, wherein the left-side line length of the fault point equals to the total length of the fault line/(1+β).

With the implementation of the invention, full parameters of an element such as an electric line and a transformer, etc. and full parameters of a fault resistance and a power generator and its control system can be identified by the fault recording data. The invention can obtain full parameters of a fault element and also a non-fault element, and the parameters precision would be increased from the current 20% to less than 1%, and the fault location precision would be increased from 20% to 0.1%.

DETAILED DESCRIPTION OF THE EMBODIMENTS

Figure 1:
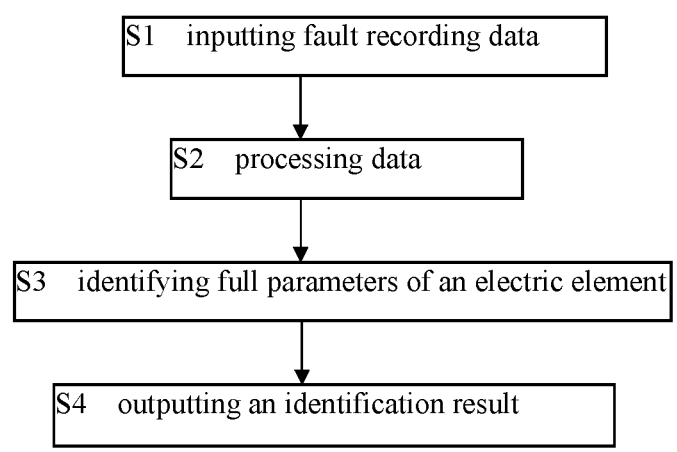
FIG. 1 is a flow chart of a method for identifying full parameters of an electric element by fault recording data according to an embodiment of the present invention.

Various embodiments of the present invention will now be described in detail, and examples of said embodiments will be shown in the drawings. It should be understood that the above embodiments described in reference to the drawing are only intended to be illustrative and explain the present invention but not to limit the scope of the present invention.

Referring to FIG. 1, it shows a method for identifying full parameters of an electric element by a fault recording data, comprising the following steps:

S1: inputting fault recording data related to an electric element;

S2: conducting data processing on the fault recording data, comprising: S21, transforming scale, S22, aligning time scale of the recording data, and S23, intercepting data during the fault time;

S3: identifying full parameters of the element by the intercepted data and an differential equation of the full parameters of the element; and S4: outputting an identified result.

Figure 2:
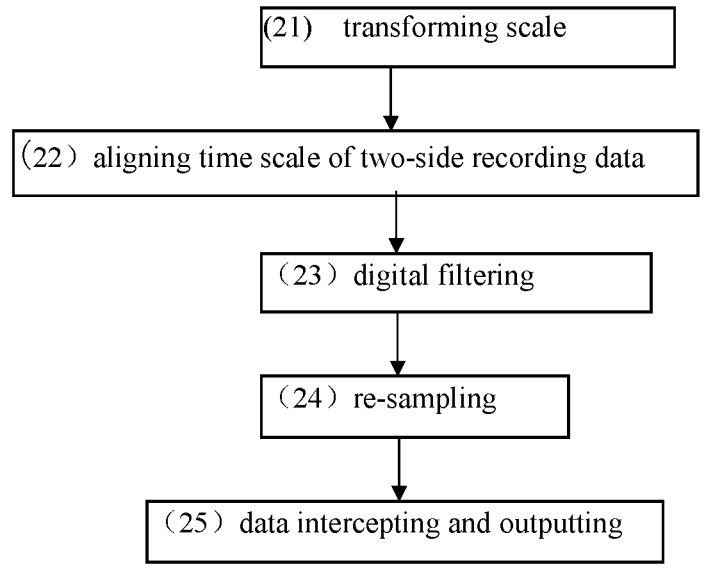
FIG. 2 is a flow char of data processing steps as shown in FIG. 1.

In present invention, full parameters of an element are full matrix elements of R, L and C, etc. Previously, they are just positive or negative zero sequence parameters, regarding the mutual impedance between positive zero sequence and negative zero sequence as zero, that is, there are only diagonal elements in the impedance matrix of the positive and negative zero sequence and the off-diagonal elements are zero. As the transposition line is inadequate and the three-phase a, b, c parameterizations are inconsistent, it causes off-diagonalization of the positive and negative zero-sequence impedance matrix. Because a plurality of additional mutual impedances shall be identified, it greatly increases the difficulty of the identification.

for a two-port element, the sampling values and sampling times of the element left-side three-phase voltages $u_{a1}$, $u_{b1}$, $u_{c1}$ and a zero sequence voltage $u_{o1}$, the left-side three-phase currents $i_{a1}$, $i_{b1}$, $i_{c1}$ and a zero sequence current $i_{o1}$, and the right-side three-phase voltages $u_{a2}$, $u_{b2}$, $u_{c2}$ and a zero sequence voltage $u_{o2}$, the right-side three-phase currents $i_{a2}$, $i_{b2}$, $i_{c2}$ and a zero sequence current $i_{o2}$ are inputted. The types of the sampling values and sampling times may be data sequences or matrixes, for example: the left-side $\{u_{a1k}, u_{b1k}, u_{c1k}, u_{o1k}, i_{a1k}, i_{b1k}, i_{c1k}, i_{o1k}, t_{1k}\}$ and the right-side $\{u_{a2j}, u_{b2j}, u_{c2j}, u_{o2j}, i_{a2j}, i_{b2j}, i_{c2j}, i_{o2j}t_{2j}\}$, k=1, 2, . . . , N, j=1, 2, . . . , M, where k stands for the left-side sampling k, $t_{1k}$ stands for the sampling time of the left-side sampling k, j stands for the right-side sampling j, $t_{2j}$ stands for the sampling time of the right-side sampling j, N and M are same or different;

for a three-port element, the sampling values and sampling times of the element first-side three-phase voltages $u_{a1}$, $u_{b1}$, $u_{c1}$ and a zero sequence voltage $u_{o1}$, the first-side three-phase currents $i_{a1}$, $i_{b1}$, $i_{c1}$ and a zero sequence current $i_{o1}$, the second-side three-phase voltages $u_{a2}$, $u_{b2}$, $u_{c2}$ and a zero sequence voltage $u_{o2}$, the second-side three-phase current $i_{a2}$, $i_{b2}$, $i_{c2}$ and and a zero sequence current $i_{o2}$ and the third-side three-phase voltages $u_{a3}$, $u_{b3}$, $u_{c3}$ and a zero sequence voltage $u_{o3}$, the third-side three-phase current $i_{a3}$, $i_{b3}$, $i_{c3}$ and a zero sequence current $i_{o3}$ are inputted. And, the types of the sampling values and sampling times may be data sequences or a matrixes, for example: the first-side $\{u_{a1k}, u_{b1k}, u_{c1k}, u_{o1k}, i_{a1k}, i_{b1k}, i_{c1k}, i_{o1k}, t_{1k}\}$, the second-side $\{u_{a2j}, u_{b2j}, u_{c2j}, u_{o2j}, i_{a2j}, i_{b2j}, i_{c2j}, i_{o2j}, t_{2j}\}$ and the third side $\{u_{a3l}, u_{b3l}, u_{c3l}, u_{o3l}, i_{a3l}, i_{b3l}, i_{c3l}, i_{o3l}, t_{3l}\}$, k=1, 2, ..., N, j=1, 2, ..., M, l=1, 2, ..., L, where k stands for the first-side sampling k, $t_{1k}$ stands for the sampling time of the first-side sampling k, j stands for the second-side sampling j, $t_{2j}$ stands for the sampling time of the second-side sampling j, l stands for the third-side sampling l, $t_{3l}$ stands for the sampling time of the third-side sampling l, and N, M and L may also be same or different;

Referring to FIG. 2, in one embodiment, the data processing steps comprise: S21 transforming scale, S22 aligning the time scale of the recording data, S23 digital filtering, S24 re-sampling and S25 intercepting the data during fault time.

Considering that the voltage of the two-side/three-side recording data goes through a voltage transformer PT and the current goes through a current transformer CT, the two-side/three-side PT ratio and CT ratio may be same or different. Generally, it needs to conduct transforming of scales (21), multiplying the voltages to their respective PT ratio, then divided by a unified voltage value, and multiplying the current to their respective CT ratio, then divided by a unified current value; and as the time scale of the two-side/three-side recording data are often out of synchronization, it needs further to align the time scale. In step 22, the method for aligning the time scale is aligning the mutation time of the two-side/three-side voltages $u_{o1}$, $u_{o2}/u_{o1}$, $u_{o2}$, $u_{o3}$; in step 23, according to the disclosure of CN Application No. 201210408534, the sampling frequency should meet certain requirements of a upper limit and a lower limit, but in practice, the sampling frequency of fault recording data is often larger than the upper limit $f_{cs}$ of the sampling frequency, thereby the recording data needs to be firstly low-pass-digital filtered, its cut-off frequency $f_c$ is set to be far less than $f_{cs}$; then in step 24, re-sampling is conducted with a frequency less than or equal to $f_{cs}$, and the two-side/three-side re-sampling frequency are the same. Finally, in step 25, the recording data during fault time are intercepted and outputted, forming the processed data corresponding to re-sampling time $t_k$, where k stands for re-sampling time k;

for a two-port element:

$$u_{abc1k} = \begin{bmatrix} u_{a1k} \\ u_{b1k} \\ u_{c1k} \end{bmatrix},$$

$$i_{abc1k} = \begin{bmatrix} i_{a1k} \\ i_{b1k} \\ i_{c1k} \end{bmatrix},$$

$$u_{abc2k} = \begin{bmatrix} u_{a2k} \\ u_{b2k} \\ u_{c2k} \end{bmatrix},$$

$$i_{abc2k} = \begin{bmatrix} i_{a2k} \\ i_{b2k} \\ i_{c2k} \end{bmatrix},$$

$$k = 1, 2, \ldots, n.$$

for a three-port element:

$$u_{abc1k} = \begin{bmatrix} u_{a1k} \\ u_{b1k} \\ u_{c1k} \end{bmatrix},$$

$$i_{abc1k} = \begin{bmatrix} i_{a1k} \\ i_{b1k} \\ i_{c1k} \end{bmatrix},$$

$$u_{abc2k} = \begin{bmatrix} u_{a2k} \\ u_{b2k} \\ u_{c2k} \end{bmatrix},$$

$$i_{abc2k} = \begin{bmatrix} i_{a2k} \\ i_{b2k} \\ i_{c2k} \end{bmatrix},$$

$$u_{abc3k} = \begin{bmatrix} u_{a3k} \\ u_{b3k} \\ u_{c3k} \end{bmatrix},$$

$$i_{abc3k} = \begin{bmatrix} i_{a3k} \\ i_{b3k} \\ i_{c3k} \end{bmatrix},$$

$$k = 1, 2, \ldots, n.$$

The differential equation can be written out according to the specialized knowledge of the power system and can be re-written to state equations in the optimal control theory:

$$\frac{d}{dt}X = A \cdot X + B \cdot u \qquad \text{Eq. 1}$$
$$y = C \cdot X + D \cdot u$$

where X is a state variable vector, t is time, u is a control vector, y is a output vector, A is a state matrix, and B, C and D are matrixes or vectors; and the estimated values $\hat{A}$, $\hat{B}$, $\hat{C}$, $\hat{D}$ of the matrixes A, B, C, D can be identified according to plenty of measurement values $\{u_k, y_k\}$ (k=1, 2, ..., N) of u and y with an identification method in adaptive control theory; and then a resistance matrix R, a inductance matrix L and a capacitance matrix C are determined according to the relationship of A, B, C, D and the element parameters RLC for deducing the differential equation of full parameters of the element.

Figure 3A:
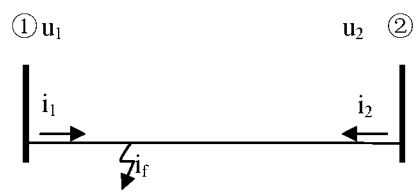
FIG. 3a and FIG. 3b are schematic diagrams of a fault line and its equivalent circuit respectively.
Figure 3B:
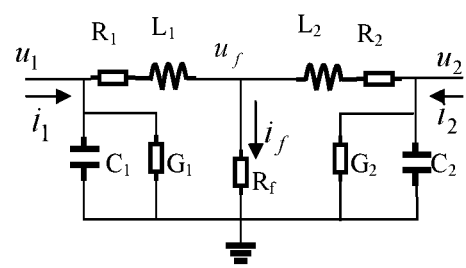

The differential equation of full parameters of the electric element and the identification procedure will be illustrated below by examples:

(1) referring to FIG. 3a and FIG. 3b, for the equations of full parameters of a fault line:

$$R_{abc1} \cdot i_{abc1p} + L_{abc1} \cdot \frac{d}{dt} i_{abc1p} = u_{abc1} - u_{abcf} \qquad \text{Eq. 2}$$

$$R_{abc2} \cdot i_{abc2p} + L_{abc2} \cdot \frac{d}{dt} i_{abc2p} = u_{abc2} - u_{abcf}$$

$$u_{abcf} = R_{abcf} \cdot i_{abcf}$$

-continued $$i_{abcf} = i_{abc1} + i_{abc2}$$

$$i_{abc1p} = i_{abc1} - G_{abc1} \cdot u_{abc1} - C_{abc1} \cdot \frac{d}{dt}u_{abc1}$$

$$i_{abc2p} = i_{abc2} - G_{abc2} \cdot u_{abc2} - C_{abc2} \cdot \frac{d}{dt}u_{abc2}$$

Where $$R_{abc2} = \beta \cdot R_{abc1},$$

$$L_{abc2} = \beta \cdot L_{abc1},$$

$$C_{abc2} = \beta \cdot C_{abc1},$$

$$G_{abc2} = \beta \cdot G_{abc1},$$

$$R_{abc1} = \begin{bmatrix} r_{a1} & r_{ab1} & r_{ac1} \\ r_{ab1} & r_{b1} & r_{bc1} \\ r_{ac1} & r_{bc1} & r_{c1} \end{bmatrix},$$

$$L_{abc1} = \begin{bmatrix} l_{a1} & m_{ab1} & m_{ac1} \\ m_{ab1} & l_{b1} & m_{bc1} \\ m_{ac1} & m_{bc1} & l_{c1} \end{bmatrix},$$

$$C_{abc1} = \begin{bmatrix} c_{a1} & c_{ab1} & c_{ac1} \\ c_{ab1} & c_{b1} & c_{bc1} \\ c_{ac1} & c_{bc1} & c_{c1} \end{bmatrix},$$

$$G_{abc1} = \begin{bmatrix} g_{a1} & g_{ab1} & g_{ac1} \\ g_{ab1} & g_{b1} & g_{bc1} \\ g_{ac1} & g_{bc1} & g_{c1} \end{bmatrix},$$

$$R_{abcf} = \begin{bmatrix} r_{af} & 0 & 0 \\ 0 & r_{bf} & 0 \\ 0 & 0 & r_{cf} \end{bmatrix},$$

where $R_{abcf}$ is determined by the fault type, and if a is connected to the ground, $r_{bf}=\infty$, $r_{cf}=\infty$, $r_{af}=r_f$; if b is connected to the ground, $r_{af}=\infty$, $r_{cf}=\infty$, $r_{bf}=r_f$; if c is connected to the ground, $r_{af}=\infty$, $r_{bf}=\infty$, $r_{cf}=r_f$; if a and b are both connected to the ground, $r_{af}=r_{f1}$, $r_{bf}=r_{f2}$, $r_{cf}=\infty$; if b and c are both connected to the ground, $r_{af}=\infty$, $r_{bf}=r_{f1}$, $r_{cf}=r_{f2}$; if a and c are both connected to the ground, $r_{af}=r_{f1}$, $r_{bf}=\infty$, $r_{cf}=r_{f2}$;

where $\beta$ is the ratio of the right-side line length and the left-side line length of the fault point, and $r_f$, $r_{f1}$, $r_{f2}$ are transition resistances.

If the intermediate variable $u_{abcf}$, $i_{abcf}$, $i_{abc1p}$ and $i_{abc2p}$ are eliminated and Eq.2 is rewritten, it can obtain the differential equation of full parameters as type of Eq.1 and obtain expressions of matrixes of A, B, C, D and $R_{abc1}$, $L_{abc1}$, $C_{abc1}$ or $r_{f1}$, $r_{f2}$ and $\beta$. After identifying $\hat{A}$, $\hat{B}$, $\hat{C}$, $\hat{D}$, the parameters of $\beta$, $r_f$ or $r_{f1}$, $r_{f2}$ and $R_{abc1}$, $L_{abc1}$, $C_{abc1}$ can be identified together consequently; wherein line parameters $R_{abc}=R_{abc1}+R_{abc2}$, $L_{abc}=L_{abc1}+L_{abc2}$, $C_{abc}=(C_{abc1}+C_{abc2})/2$ and $G_{abc}=(G_{abc1}+G_{abc2})/2$.

Figure 4A:
FIG. 4a and FIG. 4b are schematic diagrams of a non-fault line and its equivalent circuit respectively.
Figure 4B:
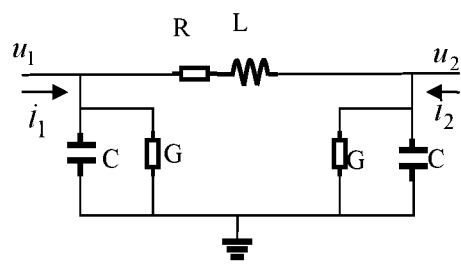

(2) referring to FIG. 4a and FIG. 4b, for the differential equations of full parameters of a non-fault line at upstream of the fault:

$$R_{abc} \cdot i_{abcp} + L_{abc} \cdot \frac{d}{dt}i_{abcp} = u_{abc1} - u_{abc2} \qquad \text{Eq. 3}$$

$$i_{abcp} = i_{abc1} - G_{abc} \cdot u_{abc1} - C_{abc} \cdot \frac{d}{dt}u_{abc1}$$

$$i_{abcp} = -i_{abc2} + G_{abc} \cdot u_{abc2} + C_{abc} \cdot \frac{d}{dt}u_{abc2}$$

where $$R_{abc} = \begin{bmatrix} r_a & r_{ab} & r_{ac} \\ r_{ab} & r_b & r_{bc} \\ r_{ac} & r_{bc} & r_c \end{bmatrix},$$

$$L_{abc} = \begin{bmatrix} l_a & m_{ab} & m_{ac} \\ m_{ab} & l_b & m_{bc} \\ m_{ac} & m_{bc} & l_c \end{bmatrix},$$

$$C_{abc} = \begin{bmatrix} c_a & c_{ab} & c_{ac} \\ c_{ab} & c_b & c_{bc} \\ c_{ac} & c_{bc} & c_c \end{bmatrix},$$

$$G_{abc} = \begin{bmatrix} g_a & g_{ab} & g_{ac} \\ g_{ab} & g_b & g_{bc} \\ g_{ac} & g_{bc} & g_c \end{bmatrix}.$$

The intermediate variable $i_{abcp}$ is eliminated, Eq.3 is re-written to be as the same type of Eq.1 and with the expression of matrixes of A, B, C, D and $R_{abc}$, $L_{abc}$ and $C_{abc}$. After identifying $\hat{A}$, $\hat{B}$, $\hat{C}$, $\hat{D}$, then the parameter of $R_{abc}$, $L_{abc}$, $C_{abc}$ can be obtained.

Eq.2 and Eq.3 are suitable for cable lines and long and short overhead lines with high and low levels. Matrixes of $R_{abc}$, $L_{abc}$, $C_{abc}$ and $G_{abc}$ are full parameters of lines; if the length of a line is short (less than 300 km) or the voltage is low (less than 500 kV), $G_{abc}$ can be ignored; if a line is short (less than 100 km) or the voltage is low (less than 200 kV), $C_{abc}$ and $G_{abc}$ can be ignored. As compared, previously, it is considered that the line parameters of the three-phase a, b, c are consistent, after transforming positive or negative zero sequence, the off-diagonal elements of $R_{120}$, $L_{120}$, $C_{120}$ are considered to be zero, and only the diagonal elements are identified, which are positive, negative and zero sequence parameters.

Figure 5A:
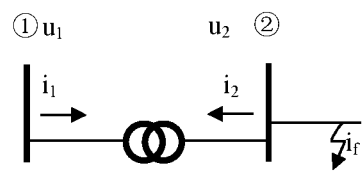
FIG. 5a and FIG. 5b are schematic diagrams of a non-fault double coil transformer and its equivalent circuit respectively.
Figure 5B:
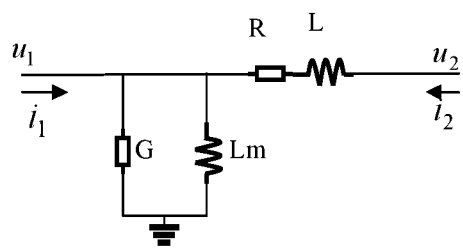

(3) referring to FIG. 5a and FIG. 5b, for the differential equations of full parameters of a non-fault double coil transformer at upstream of the fault:

$$R_{abc} \cdot i_{abcp} + L_{abc} \cdot \frac{d}{dt}i_{abcp} = u_{abc1} - u_{abc2} \qquad \text{Eq. 4}$$

$$i_{abcp} = i_{abc1} - G_{abc} \cdot u_{abc1} - i_{abcm}$$

$$u_{abc1} = L_{abcm} \cdot \frac{d}{dt}i_{abcm}$$

The intermediate variable $i_{abcp}$ is eliminated, Eq.4 is also rewritten to be as the type of Eq.1 and with the expression of matrixes of A, B, C, D and $R_{abc}$, $L_{abc}$, $L_{abcm}$ and $G_{abc}$. After identifying $\hat{A}$, $\hat{B}$, $\hat{C}$, $\hat{D}$, then parameters of $R_{abc}$, $L_{abc}$, $L_{abcm}$ and $G_{abc}$ can be obtained.

Or: the transformer three-phase parameters are consistent, and the three-phase is transformed into positive or negative zero sequence, thereby obtaining equations:

$$R_{120} \cdot i_{120p} + L_{120} \cdot \frac{d}{dt}i_{120cp} = u_{1201} - u_{1202} \qquad \text{Eq. 5}$$

$$i_{120p} = i_{1201} - G_{120} \cdot u_{1201} - i_{120m}$$

$$u_{1201} = L_{120m} \cdot \frac{d}{dt}i_{120m}$$

where

-continued $$R_{120} = \begin{bmatrix} r_1 & 0 & 0 \\ 0 & r_1 & 0 \\ 0 & 0 & r_0 \end{bmatrix},$$

$$L_{120} = \begin{bmatrix} l_1 & 0 & 0 \\ 0 & l_1 & 0 \\ 0 & 0 & l_0 \end{bmatrix},$$

$$G_{120} = \begin{bmatrix} g_1 & 0 & 0 \\ 0 & g_1 & 0 \\ 0 & 0 & g_0 \end{bmatrix},$$

$$L_{120m} = \begin{bmatrix} l_{1m} & 0 & 0 \\ 0 & l_{1m} & 0 \\ 0 & 0 & l_{0m} \end{bmatrix};$$

The intermediate variable $i_{120p}$ is eliminated, Eq.5 is re-written to be as the same form of Eq.1 and with the expression of matrixes of A, B, C, D and $R_{120}$, $L_{120}$, $L_{120m}$ and $G_{120}$. After identifying $\hat{A}$, $\hat{B}$, $\hat{C}$, $\hat{D}$, then the parameters of $r_1$, $r_0$, $l_1$, $l_0$, $g_1$, $g_0$, $l_m$, $l_{0m}$ can be obtained.

Figure 6A:
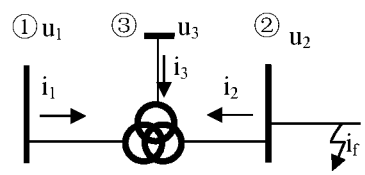
FIG. 6a and FIG. 6b are schematic diagrams of a non-fault three-coil transformer and its equivalent circuit respectively.
Figure 6B:
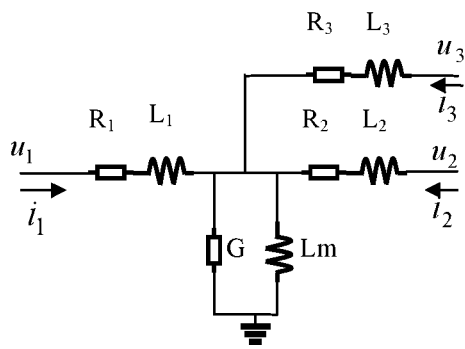

(4) referring to FIG. 6a and FIG. 6b, for a non-fault three-coil transformer, the transformer three-phase parameters are consistent, the three-phase is transformed into positive or negative zero sequence, thereby obtaining the differential equations of full parameters:

$$R_{1201} \cdot i_{1201} + L_{1201} \cdot \frac{d}{dt} i_{1201} = u_{1201} - u_{120p} \quad \text{Eq. 6}$$

$$R_{1202} \cdot i_{1202} + L_{1202} \cdot \frac{d}{dt} i_{1202} = u_{1202} - u_{120p}$$

$$R_{1203} \cdot i_{1203} + L_{1203} \cdot \frac{d}{dt} i_{1203} = u_{1203} - u_{120p}$$

$$u_{120p} = L_{120m} \cdot \frac{d}{dt} i_{120m}$$

$$i_{1201} + i_{1202} + i_{1203} = G_{120} \cdot u_{120p} + i_{120m}$$

where $$R_{1201} = \begin{bmatrix} r_{11} & 0 & 0 \\ 0 & r_{11} & 0 \\ 0 & 0 & r_{01} \end{bmatrix},$$

$$L_{1201} = \begin{bmatrix} l_{11} & 0 & 0 \\ 0 & l_{11} & 0 \\ 0 & 0 & l_{01} \end{bmatrix},$$

$$R_{1202} = \begin{bmatrix} r_{12} & 0 & 0 \\ 0 & r_{12} & 0 \\ 0 & 0 & r_{02} \end{bmatrix},$$

$$L_{1202} = \begin{bmatrix} l_{12} & 0 & 0 \\ 0 & l_{12} & 0 \\ 0 & 0 & l_{02} \end{bmatrix},$$

$$R_{1203} = \begin{bmatrix} r_{13} & 0 & 0 \\ 0 & r_{13} & 0 \\ 0 & 0 & r_{03} \end{bmatrix},$$

$$L_{1203} = \begin{bmatrix} l_{13} & 0 & 0 \\ 0 & l_{13} & 0 \\ 0 & 0 & l_{03} \end{bmatrix},$$

$$G_{120} = \begin{bmatrix} g_1 & 0 & 0 \\ 0 & g_1 & 0 \\ 0 & 0 & g_0 \end{bmatrix},$$

$$L_{120m} = \begin{bmatrix} l_{1m} & 0 & 0 \\ 0 & l_{1m} & 0 \\ 0 & 0 & l_{0m} \end{bmatrix};$$

The intermediate variable $i_{120p}$ is eliminated, Eq.6 is rewritten to be as the same type of Eq.1 and with the expression of A, B, C, D and $R_{1201}$, $L_{1201}$, $R_{1202}$, $L_{1202}$, $R_{1203}$, $L_{1203}$, $L_{120m}$ and $G_{120}$. After identifying A, B, C, D, then the parameters of $r_{11}$, $r_{01}$, $l_{11}$, $l_{01}$, $r_{12}$, $r_{02}$, $l_{12}$, $l_{02}$, $r_{131}$, $r_{03}$, $l_{13}$, $l_{03}$, $g_1$, $g_0$, $l_{1m}$ and $l_{0m}$ can be obtained consequently.

Similarly, a person skilled in the art can obtain differential equations of an electric element such as a power generator and lines of double circuits on the same tower, etc. according to the electric knowledge. And for a power generator, the parameters of the generator and its governor and excitor can be identified after obtaining the differential equation of its dqo coordinates and inputting the recording data of the generator terminal voltage, the current, the exciting voltage, the current and the rotational speed of the power generator after the external fault of the generator.

Figure 7A:
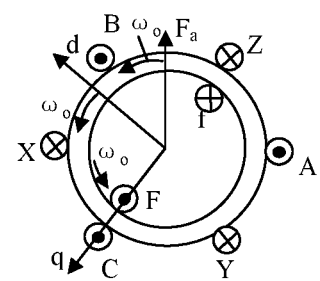
FIG. 7a and FIG. 7b are an intermediate vector diagram of a non-fault power generator and a schematic diagram of the voltage/current of the generator terminal in the positive direction.
Figure 7B:
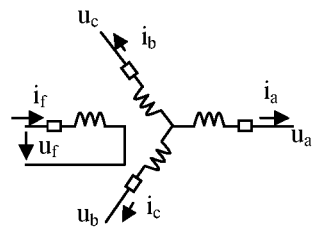

(5) referring to FIG. 7a and FIG. 7b, for a non-fault power generator:

The step S1 of inputting fault recording data related to an electric element comprises: for a non-fault power generator, inputting the sampling values $\{u_{ak}, u_{bk}, u_{ck}, i_{ak}, i_{bk}, i_{ck}\}$ of the generator terminal three-phase voltages $u_a$, $u_b$, $u_c$ and the three-phase currents $i_a$, $i_b$, $i_c$, and inputting the sampling values $\{\omega_{0k}, \omega_k, \delta_k, u_{fk}, i_{fk}\}$ of the angular frequency $\omega_0$ of the power grid, the rotational speed $\omega$ of the power generator, the power angle $\delta$, the exciting voltage $u_f$ and the exciting current $i_f$ and the sampling times $\{t_k\}$, where k=1, 2, ..., N, $\omega_{0k}=2\pi f_{0k}$, and $f_{0k}$ is the power frequency period of the power grid.

The step S3 of identifying full parameters of the element by a differential equation of the full parameters of the element comprises:

according to the differential equations of full parameters of a non-fault power generator:

$$\frac{d\delta}{dt} = \omega - \omega_0$$

$$\frac{T_J}{\omega_0} \cdot \frac{d\omega}{dt} = M_m - M_e - D \cdot (\omega - \omega_0)$$

$$L_{dfDqQ} \cdot \frac{d}{dt} \begin{bmatrix} -i_d \\ i_f \\ i_D \\ -i_q \\ i_Q \end{bmatrix} = \omega \cdot \begin{bmatrix} 0 & 0 & 0 & -l_q & -m_{aQ} \\ 0 & 0 & 0 & 0 & 0 \\ 0 & 0 & 0 & 0 & 0 \\ l_d & m_{ad} & m_{aD} & 0 & 0 \\ 0 & 0 & 0 & 0 & 0 \end{bmatrix} \cdot \begin{bmatrix} -i_d \\ i_f \\ i_D \\ -i_q \\ i_Q \end{bmatrix} - \begin{bmatrix} r_a & 0 & 0 & 0 & 0 \\ 0 & r_f & 0 & 0 & 0 \\ 0 & 0 & r_D & 0 & 0 \\ 0 & 0 & 0 & r_a & 0 \\ 0 & 0 & 0 & 0 & r_Q \end{bmatrix} \cdot \begin{bmatrix} -i_d \\ i_f \\ i_D \\ -i_q \\ i_Q \end{bmatrix} + \begin{bmatrix} u_d \\ u_f \\ 0 \\ u_q \\ 0 \end{bmatrix}$$

$$T_g \cdot \frac{d\mu}{dt} = -\mu + k_g \cdot (\omega - \omega_0)$$

-continued $$0.5 \cdot T_w \cdot \frac{dP_m}{dt} = -P_m + k_w \cdot \mu - T_w \cdot \frac{d\mu}{dt},$$

$$\text{或 } T_h \cdot \frac{dP_m}{dt} = -P_m + k_h \cdot \mu$$

$$\frac{d\mu_f}{dt} = e$$

$$T_a \cdot T_e \cdot \frac{de}{dt} = -(T_a + T_e) \cdot e - u_f + k_a \cdot (u_t - u_0)$$

identifying the parameters of $T_J$, $D$, $l_d$, $l_q$, $l_f$, $l_D$, $l_Q$, $m_{ad}$, $m_{aD}$, $m_{aQ}$, $m_{fD}$, $r_d$, $r_q$, $r_f$, $r_D$, $r_Q$, $T_g$, $k_g$, $T_a$, $k_a$, $T_e$ and $T_w$ and $k_w$ or $T_h$ and $k_h$;

wherein the values $\{u_{dk}, u_{qk}, i_{dk}, i_{qk}\}$ of $u_d$, $u_q$, $i_d$, $i_q$, $k=1, 2, \ldots, N$ are obtained by transforming the recording data of the three-phase voltages and the three-phase currents $i_{a1}$, $i_{b1}$, $i_{c1}$:

$$\begin{bmatrix} u_d \\ u_q \end{bmatrix} = T \cdot \begin{bmatrix} u_a \\ u_b \\ u_c \end{bmatrix},$$

$$\begin{bmatrix} i_d \\ i_q \end{bmatrix} = T \cdot \begin{bmatrix} i_a \\ i_b \\ i_c \end{bmatrix},$$

$$T = \frac{2}{3} \cdot \begin{bmatrix} \cos(\theta) & \cos\left(\theta - \frac{2}{3} \cdot \pi\right) & \cos\left(\theta + \frac{2}{3} \cdot \pi\right) \\ -\sin(\theta) & -\sin\left(\theta - \frac{2}{3} \cdot \pi\right) & -\sin\left(\theta + \frac{2}{3} \cdot \pi\right) \end{bmatrix};$$

where $$M_e = [i_q \ -i_d] \cdot \begin{bmatrix} l_d & m_{ad} & m_{aD} & 0 & 0 \\ 0 & 0 & 0 & l_q & m_{aQ} \end{bmatrix} \cdot \begin{bmatrix} -i_d \\ i_f \\ i_D \\ -i_q \\ i_Q \end{bmatrix},$$

$$L_{dfDqQ} = \begin{bmatrix} l_d & m_{ad} & m_{aD} & 0 & 0 \\ m_{ad} & l_f & m_{fD} & 0 & 0 \\ m_{aD} & m_{fD} & l_D & 0 & 0 \\ 0 & 0 & 0 & l_q & m_{aQ} \\ 0 & 0 & 0 & m_{aQ} & l_Q \end{bmatrix},$$

$$u_t = \sqrt{u_d^2 + u_q^2},$$

$$P_m = \omega \cdot M_m;$$

where $P_m$ is the mechanical power, $M_m$ is the mechanical torque, $u_t$ is terminal voltage of the power generator, $M_e$ is the electromagnetic torque, $L_{dfDqQ}$ is the electrical inductance and mutual inductance matrix of stator and rotor of the power generator, Tg is the time constant of the electro-hydraulic governor, $k_g$ is the amplification factor of the electro-hydraulic governor, $\mu$ is the valve opening, $T_w$ is the time constant of the hydraulic turbine, $k_w$ is the work-done factor of the hydraulic turbine, $T_h$ is the time constant of the high-pressure cylinder of the steam turbine, $k_h$ is the work-done factor of the high-pressure cylinder of the steam turbine, $T_a$ is the time constant of the excitation controller, $T_e$ is the time constant of the exciting dynamo, $k_a$ is the amplification factor of the excitation controller, $T_J$ is the rotor inertia time constant, $\delta$ is the power angle of the power generator, $\omega_0$ is the angular speed of the power grid, $\omega$ is the angular speed of the rotor of the generator, $u_f$ is the exciting voltage, $i_f$ is the exciting current, $i_D$ is the direct-axis damping current, $i_Q$ is the transverse-axis damping current, and D is the damping coefficient.

Wherein the third differential equation of differential equations of full parameters of the non-fault power generator is simplified as:

$$L_{dfq} \cdot \frac{d}{dt} \begin{bmatrix} -i_d \\ i_f \\ -i_q \end{bmatrix} = \begin{bmatrix} -r_a & 0 & -\omega \cdot l_q \\ 0 & -r_f & 0 \\ \omega \cdot l_d & \omega \cdot m_{ad} & -r_a \end{bmatrix} \cdot \begin{bmatrix} -i_d \\ i_f \\ -i_q \end{bmatrix} + \begin{bmatrix} u_d \\ u_f \\ u_q \end{bmatrix},$$

where $L_{dfq} = \begin{bmatrix} l_d & m_{ad} & 0 \\ m_{ad} & l_f & 0 \\ 0 & 0 & l_q \end{bmatrix}$.

The present invention further provides a system for identifying full parameters of a power generator by a fault recording data, comprising:

a fault recording device of the generator, used for measuring and storing fault recording data, comprising: conducting sampling for a power frequency period $f_0$ of a power grid, a generator terminal three-phase voltage $u_{abc}$, a three-phase current $i_{abc}$, a rotational speed $\omega$ of the power generator, a power angle $\delta$, a exciting voltage $u_f$ and a exciting current $i_f$ for obtaining corresponding sampling values; according to $$\alpha = \frac{d\omega}{dt}$$

and $\omega_0 = 2\pi f_0$, calculating sampling values of a accelerated speed $\alpha$ of a rotor and a angular frequency $\omega_0$ of the power grid; and recording and storing sampling times and the sampling values, wherein the fault recording begins at 2 to 10 cycle waves before short circuit and stops until the fault is removed and the rotational speed of the generator is stable;

a data processing unit, used for transforming scale and conducting digital low-pass filtering on the recording data, and then conducting re-sampling and outputting; and a parameter identifying unit, used for identifying full parameters of the power generator and its controlling system by a differential equation of full parameters of the power generator and its controlling system;

wherein said data processing unit and the parameter identifying unit is able to be located in the fault recording device or on a computer.

The present invention further provides a method for locating a line fault point with a fault recording data, comprising the following steps:

S1: inputting fault recording data of a line;
S2: conducting data processing on the data, comprising: S21 transforming scale, S22 aligning time scale of the recording data, S23 conducting digital low-pass filtering, S24 re-sampling and S25 intercepting the data during the fault time;
S3: identifying a transition resistance and the ratio β of the right-side line length and the left-side line length of the fault point with the data during the fault time and a differential equation of full parameters of the fault line;

Wherein said differential equations of the full parameters are:

$$R_{abc1} \cdot i_{abc1p} + L_{abc1} \cdot \frac{d}{dt} i_{abc1p} = u_{abc1} - u_{abcf}$$

$$R_{abc2} \cdot i_{abc2p} + L_{abc2} \cdot \frac{d}{dt} i_{abc2p} = u_{abc2} - u_{abcf}$$

$$u_{abcf} = R_{abcf} \cdot i_{abcf}$$

$$i_{abcf} = i_{abc1} + i_{abc2}$$

$$i_{abc1p} = i_{abc1} - G_{abc1} \cdot u_{abc1} - C_{abc1} \cdot \frac{d}{dt} u_{abc1}$$

$$i_{abc2p} = i_{abc2} - G_{abc2} \cdot u_{abc2} - C_{abc2} \cdot \frac{d}{dt} u_{abc2}$$

where $R_{abc2} = \beta \cdot R_{abc1}$, $L_{abc2} = \beta \cdot L_{abc1}$, $C_{abc2} = \beta \cdot C_{abc1}$, $$R_{abc1} = \begin{bmatrix} r_{a1} & r_{ab1} & r_{ac1} \\ r_{ab1} & r_{b1} & r_{bc1} \\ r_{ac1} & r_{bc1} & r_{c1} \end{bmatrix}, L_{abc1} = \begin{bmatrix} l_{a1} & m_{ab1} & m_{ac1} \\ m_{ab1} & l_{b1} & m_{bc1} \\ m_{ac1} & m_{bc1} & l_{c1} \end{bmatrix},$$

$$C_{abc1} = \begin{bmatrix} c_{a1} & c_{ab1} & c_{ac1} \\ c_{ab1} & c_{b1} & c_{bc1} \\ c_{ac1} & c_{bc1} & c_{c1} \end{bmatrix}, R_{abcf} = \begin{bmatrix} r_{af} & 0 & 0 \\ 0 & r_{bf} & 0 \\ 0 & 0 & r_{cf} \end{bmatrix},$$

where $R_{abcf}$ is determined by the fault type, and if a is connected to the ground, $r_{bf}=\infty$, $r_{cf}=\infty$, $r_{af}=r_f$; if b is connected to the ground, $r_{af}=\infty$, $r_{cf}=\infty$, $r_{bf}=r_f$; if c is connected to the ground, $r_{af}=\infty$, $r_{bf}=\infty$, $r_{cf}=r_f$; if a and b are both connected to the ground, $r_{af}=r_{f1}$, $r_{bf}=r_{f2}$, $r_{cf}=\infty$; if b and c are both connected to the ground, $r_{af}=\infty$, $r_{bf}=r_{f1}$, $r_{cf}=r_{f2}$; if a and c are both connected to the ground, $r_{af}=r_{f1}$, $r_{bf}=\infty$, $r_{cf}=r_{f2}$; and S4: outputting the transition resistances $r_f$ or $r_{f1}$ and $r_{f2}$ and the position of the fault point, wherein the left-side line length of the fault point equals to the total length of the fault line/(1+β).

With the implementation of the invention, full parameters of an element such as an electric line and a transformer, etc. and full parameters of a fault resistance and a power generator and its control system can be identified by the fault recording data. The invention can obtain full parameters of a fault element and also a non-fault element, and the parameters precision would be increased from the current 20% to less than 1%, and the fault location precision would be increased from 20% to 0.1%.

For parameters of power transmission lines, there is still no standards internationally or domestically, theoretical parameters are adopted in Europe and America, and actual measurement parameters are adopted in China, both of which are with larger errors. Since the power transmission line is the major element in the power grid, and whether the parameters are accurate or not is directly relevant to computing precision for all power grids and even to a right and wrong determination. The present invention processes fault recording data according to the theory of sampling frequency upper and lower limits, and full parameters of lines are identified in accordance with a method in adaptive control theory. It can not only avoid round 10% of the frequency error caused by decomposing decay component with the Fourier decomposition, but also can identify the full parameters impedance matrix and electrical admittance matrix of the lines. Simulation experiments show that the error between the reproduced current waveforms and the simulated waveform ≤0.01%, the parameters error ≤1%, the location error ≤0.1%, thereby parameters accuracy is 10 times than the traditional method which only uses positive or negative zero sequence.

In addition, the method for identifying full parameters of an electric element by fault recording data in present invention also has a variety of applications, and the present invention provides a method for locating a fault line, by which the fault point of the line can accurately be located promptly.

What is claimed is:
1. A method for identifying full parameters of a line by a fault recording data, wherein, comprising the following steps:
   S1: inputting, by an inputting device, fault recording data related to the line;
   S2: conducting data processing, by a processor, on the fault recording data, comprising:
   S21, transforming scale,
   S22, aligning time scale of the recording data,
   S23a, determining an upper limit $f_{cs}$ for the sampling frequency, controlling a low-pass filter whose the cut-off frequency $f_c$ is less than $f_{cs}$ performing a digital low-pass filtering for filtering the high-frequency signals to avoid frequency mixing when conducting re-sampling;
   S23b, conducting re-sampling on the recording data with a frequency which is less than or equal to $f_{cs}$, and
   S23, intercepting data during the fault time;
   S3: identifying, by the processor, full parameters of the line by the intercepted data and an differential equation of the full parameters of the line, comprising:
   according to the state equations which changed from the differential equation of full parameters of the line,

$$\frac{d}{dt} X = A \cdot X + B \cdot u$$

$$y = C \cdot X + D \cdot u$$

Where X is a state variable vector, t is time, u is a control vector, y is a output vector, A is a state matrix, and B, C and D are matrixes or vectors,
identifying the estimated values $\hat{A}$, $\hat{B}$, $\hat{C}$, $\hat{D}$ for the matrixes A, B, C, D; and
determining a resistance matrix R, a inductance matrix L and a capacitance matrix C according to the relationship of A, B, C, D for deducing the differential equation of full parameters of the line and the line parameters RLC;
Wherein, for the differential equation of full parameters of a fault line:

$$R_{abc1} \cdot i_{abc1p} + L_{abc1} \cdot \frac{d}{dt} i_{abc1p} = u_{abc1} - u_{abcf}$$

$$R_{abc2} \cdot i_{abc2p} + L_{abc2} \cdot \frac{d}{dt} i_{abc2p} = u_{abc2} - u_{abcf}$$

$$u_{abcf} = R_{abcf} \cdot i_{abcf}$$

$$i_{abcf} = i_{abc1} + i_{abc2}$$

$$i_{abc1p} = i_{abc1} - G_{abc1} \cdot u_{abc1} - C_{abc1} \cdot \frac{d}{dt} u_{abc1}$$

$$i_{abc2p} = i_{abc2} - G_{abc2} \cdot u_{abc2} - C_{abc2} \cdot \frac{d}{dt} u_{abc2}$$

where $R_{abc2} = \beta \cdot R_{abc1}$, $L_{abc2} = \beta \cdot L_{abc1}$, $C_{abc2} = \beta \cdot C_{abc1}$, $G_{abc2} = \beta \cdot G_{abc1}$, -continued $$R_{abc1} = \begin{bmatrix} r_{a1} & r_{ab1} & r_{ac1} \\ r_{ab1} & r_{b1} & r_{bc1} \\ r_{ac1} & r_{bc1} & r_{c1} \end{bmatrix}, L_{abc1} = \begin{bmatrix} l_{a1} & m_{ab1} & m_{ac1} \\ m_{ab1} & l_{b1} & m_{bc1} \\ m_{ac1} & m_{bc1} & l_{c1} \end{bmatrix},$$

$$C_{abc1} = \begin{bmatrix} c_{a1} & c_{ab1} & c_{ac1} \\ c_{ab1} & c_{b1} & c_{bc1} \\ c_{ac1} & c_{bc1} & c_{c1} \end{bmatrix}, G_{abc1} = \begin{bmatrix} g_{a1} & g_{ab1} & g_{ac1} \\ g_{ab1} & g_{b1} & g_{bc1} \\ g_{ac1} & g_{bc1} & g_{c1} \end{bmatrix},$$

$$R_{abcf} = \begin{bmatrix} r_{af} & 0 & 0 \\ 0 & r_{bf} & 0 \\ 0 & 0 & r_{cf} \end{bmatrix},$$

Where $R_{abcf}$ is determined by the fault type, and if a is connected to the ground, $r_{bf}=\infty$, $r_{cf}=\infty$, $r_{af}=r_f$; if b is connected to the ground, $r_{af}=\infty$, $r_{cf}=\infty$, $r_{bf}=r_f$; if c is connected to the ground, $r_{af}=\infty$, $r_{bf}=\infty$, $r_{cf}=r_f$; if a and b are both connected to the ground, $r_{af}=r_{f1}$, $r_{bf}=r_{f2}$, $r_{cf}=\infty$; if b and c are both connected to the ground, $r_{af}=\infty$, $r_{bf}=r_{f1}$, $r_{cf}=r_{f2}$; if a and c are both connected to the ground, $r_{af}=r_{f1}$, $r_{bf}=\infty$, $r_{cf}=r_{f2}$; and identifying together the parameters of β, $r_f$ or $r_{f1}$ and $r_{f2}$ and the parameters of $R_{abc1}$, $L_{abc1}$, $C_{abc1}$, $G_{abc1}$, wherein the line parameters $R_{abc}=R_{abc1}+R_{abc2}$, $L_{abc}=L_{abc1}+L_{abc2}$, $C_{abc}=(C_{abc1}+C_{abc2})/2$ and $G_{abc}=(G_{abc1}+C_{abc2})/2$; and S4: outputting, by an outputting device, an identified result.

2. The method according to claim 1, wherein said step S1 of inputting fault recording data related to the line comprises:

inputting the sampling values and sampling times of the line left-side three-phase voltages $u_{a1}$, $u_{b1}$, $u_{c1}$ and a zero sequence voltage $u_{o1}$, the left-side three-phase currents $i_{a1}$, $i_{b1}$, $i_{c1}$ and a zero sequence current $i_{o1}$, and the right-side three-phase voltages $u_{a2}$, $u_{b2}$, $u_{c2}$ and a zero sequence voltage $u_{o2}$, the right-side three-phase currents $i_{a2}$, $i_{b2}$, $i_{c2}$ and a zero sequence current $i_{o2}$: the left-side $\{u_{a1k}, u_{b1k}, u_{c1k}, u_{o1k}, i_{a1k}, i_{b1k}, i_{c1k}, i_{o1k}, t_{1k}\}$ and the right-side $\{u_{a2j}, u_{b2j}, u_{c2j}, u_{o2j}, i_{a2j}, i_{b2j}, i_{c2j}, i_{o2j}, t_{2j}\}$, k=1, 2, ..., N, j=1, 2, ..., M.

3. The method according to claim 2, wherein:

said step S21 of transforming scale comprises: multiplying the voltages of the two-side recording data to their respective PT ratio, then divided by a unified voltage base, and multiplying the currents to their respective CT ratio, then divided by a unified current base;

said step S22 of aligning time scale of the recording data comprises taking a principle of aligning the mutation time of the two-side voltages $u_{o1}$, $u_{o2}$;

said step S23 of intercepting the data during fault time comprises: only intercepting data during the fault time period, with the data before the fault and after removal of the fault being removed.

4. The method according to claim 2, wherein adopting the same re-sampling frequency for the two-side, outputting data:

$$u_{abc1k} = \begin{bmatrix} u_{a1k} \\ u_{b1k} \\ u_{c1k} \end{bmatrix}, i_{abc1k} = \begin{bmatrix} i_{a1k} \\ i_{b1k} \\ i_{c1k} \end{bmatrix}, u_{abc2k} = \begin{bmatrix} u_{a2k} \\ u_{b2k} \\ u_{c2k} \end{bmatrix}, i_{abc2k} = \begin{bmatrix} i_{a2k} \\ i_{b2k} \\ i_{c2k} \end{bmatrix}.$$

$$k = 1, 2, \ldots, n;$$

5. The method according to claim 2, wherein:

for the differential equations of full parameters of a non-fault line:

$$R_{abc} \cdot i_{abcp} + L_{abc} \cdot \frac{d}{dt} i_{abcp} = u_{abc1} - u_{abc2}$$

$$i_{abcp} = i_{abc1} - G_{abc} \cdot u_{abc1} - C_{abc} \cdot \frac{d}{dt} u_{abc1}$$

$$i_{abcp} = -i_{abc2} + G_{abc} \cdot u_{abc2} + C_{abc} \cdot \frac{d}{dt} u_{abc2}$$

Where $$R_{abc} = \begin{bmatrix} r_a & r_{ab} & r_{ac} \\ r_{ab} & r_b & r_{bc} \\ r_{ac} & r_{bc} & r_c \end{bmatrix}, L_{abc} = \begin{bmatrix} l_a & m_{ab} & m_{ac} \\ m_{ab} & l_b & m_{bc} \\ m_{ac} & m_{bc} & l_c \end{bmatrix},$$

$$C_{abc} = \begin{bmatrix} c_a & c_{ab} & c_{ac} \\ c_{ab} & c_b & c_{bc} \\ c_{ac} & c_{bc} & c_c \end{bmatrix}, G_{abc} = \begin{bmatrix} g_a & g_{ab} & g_{ac} \\ g_{ab} & g_b & g_{bc} \\ g_{ac} & g_{bc} & g_c \end{bmatrix},$$

and consequently the parameters of $R_{abc}$, $L_{abc}$, $C_{abc}$ are identified.

6. A method for locating a line fault point with a fault recording data, wherein, comprising the following steps:

S1: inputting, by an inputting device, fault recording data of a line;

S2: conducting data processing, by a processor, on the fault recording data, comprising: S21 transforming scale; S22 aligning time scale of the recording data; S23 controlling a low-pass filter performing digital low-pass filtering; S24 re-sampling; S25 intercepting the data during the fault time;

S3: identifying, by the processor, a transition resistance and the ratio β of the right-side line length and the left-side line length of the fault point with the data during the fault time and a differential equation of full parameters of the fault line;

Wherein said differential equations of the full parameters are:

$$R_{abc1} \cdot i_{abc1p} + L_{abc1} \cdot \frac{d}{dt} i_{abc1p} = u_{abc1} - u_{abcf}$$

$$R_{abc2} \cdot i_{abc2p} + L_{abc2} \cdot \frac{d}{dt} i_{abc2p} = u_{abc2} - u_{abcf}$$

$$u_{abcf} = R_{abcf} \cdot i_{abcf}$$

$$i_{abcf} = i_{abc1} + i_{abc2}$$

$$i_{abc1p} = i_{abc1} - G_{abc1} \cdot u_{abc1} - C_{abc1} \cdot \frac{d}{dt} u_{abc1}$$

$$i_{abc2p} = i_{abc2} - G_{abc2} \cdot u_{abc2} - C_{abc2} \cdot \frac{d}{dt} u_{abc2}$$

Where $R_{abc2} = \beta \cdot R_{abc1}$, $L_{abc2} = \beta \cdot L_{abc1}$, $C_{abc2} = \beta \cdot C_{abc1}$, $$R_{abc1} = \begin{bmatrix} r_{a1} & r_{ab1} & r_{ac1} \\ r_{ab1} & r_{b1} & r_{bc1} \\ r_{ac1} & r_{bc1} & r_{c1} \end{bmatrix}, L_{abc1} = \begin{bmatrix} l_{a1} & m_{ab1} & m_{ac1} \\ m_{ab1} & l_{b1} & m_{bc1} \\ m_{ac1} & m_{bc1} & l_{c1} \end{bmatrix},$$

$$C_{abc1} = \begin{bmatrix} c_{a1} & c_{ab1} & c_{ac1} \\ c_{ab1} & c_{b1} & c_{bc1} \\ c_{ac1} & c_{bc1} & c_{c1} \end{bmatrix}, R_{abcf} = \begin{bmatrix} r_{af} & 0 & 0 \\ 0 & r_{bf} & 0 \\ 0 & 0 & r_{cf} \end{bmatrix},$$

Where $R_{abcf}$ is determined by the fault type, and if a is connected to the ground, $r_{bf}=\infty$, $r_{cf}=\infty$, $r_{af}=r_f$; if b is connected to the ground, $r_{af}=\infty$, $r_{cf}=\infty$, $r_{bf}=r_f$; if c is connected to the ground, $r_{af}=\infty$, $r_{cf}=\infty$, $r_{cf}=r_f$; if a and b are both connected to the ground, $r_{af}=r_{f1}$, $r_{bf}=r_{f2}$, $r_{cf}=\infty$; if b and c are both connected to the ground, $r_{af}=\infty$, $r_{bf}=r_{f1}$, $r_{cf}=r_{f2}$; if a and c are both connected to the ground, $r_{af}=r_{f1}$, $r_{bf}=\infty$, $r_{cf}=r_{f2}$; and S4: outputting, by an outputting device, the transition resistances $r_f$ or $r_{f1}$ and $r_{f2}$ and the position of the fault point, wherein the left-side line length equals to the total length of the fault line/$(1+\beta)$.

* * * * *